(12) United States Patent
Srinivasa

(10) Patent No.: US 9,197,396 B1
(45) Date of Patent: Nov. 24, 2015

(54) OUT-OF-LOCK BASED CLOCK ACQUISITION

(71) Applicant: Avago Technologies General IP (Singapore) Pte. Ltd., Singapore (SG)

(72) Inventor: Sunil Srinivasa, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/611,235

(22) Filed: Jan. 31, 2015

(51) Int. Cl.
*H04L 7/00* (2006.01)
*H04L 25/00* (2006.01)
*H04L 25/40* (2006.01)

(52) U.S. Cl.
CPC .................................... *H04L 7/0016* (2013.01)

(58) Field of Classification Search
CPC ................................................... H04L 7/0016
See application file for complete search history.

(56) References Cited

U.S. PATENT DOCUMENTS

| | | | | |
|---|---|---|---|---|
| 6,683,920 B1 * | 1/2004 | Coy | .............................. | 375/326 |
| 8,804,892 B2 | 8/2014 | Kyles | | |
| 2004/0193970 A1 * | 9/2004 | Dietrich et al. | ............... | 714/700 |
| 2005/0073343 A1 * | 4/2005 | Kim et al. | ..................... | 327/156 |
| 2010/0289544 A1 * | 11/2010 | Lee et al. | ...................... | 327/159 |

FOREIGN PATENT DOCUMENTS

WO   WO-2013/112701 A1   1/2013

OTHER PUBLICATIONS

J. D. H. Alexander, fiClock Recovery From Random Binary Signals,fl Electronics Letters, vol. 11, pp. 541-542, Oct. 1975.
Pallotta, "A Low-Power Clock and Data Recovery Circuit for 2.5 Gb/S SDH Receivers", ACM 1-58113-190-9/00/0007 ISLPED 2000.
Park et al., "A 40 Gb/s Clock and Data Recovery Module with Improved Phase-Locked Loop Circuits", ETRI Journal, vol. 30, No. 2, Apr. 2008.

* cited by examiner

Primary Examiner — Erin File

(57) ABSTRACT

An apparatus for recovering a clock from a data signal includes an out-of-lock detector configured to detect when a receiver data clock has a frequency offset with respect to a transmitter data clock associated with the data signal, an out-of-lock counter configured to count out-of-lock conditions for the receiver data clock, and a loop filter configured to correct the frequency offset in the receiver data clock based at least in part on the count of out-of-lock conditions.

20 Claims, 4 Drawing Sheets it is necessary to recover the sampling clock at the receiver to sample the received data at the correct points. A clock and data recovery (CDR) circuit in a serializer and de-serializer detects timing of the input data stream and uses the detected timing to set correct frequency and phase of a local clock from which the sampling clock for data sampling is derived. The objective of the clock and data recovery circuit is to track the phase of a sampling clock based on some criterion. However, digital clock and data recovery circuits typically cannot acquire the transmitter clock where a large frequency offset in the thousands of parts per million between the transmitter and receiver clocks, due to their high latencies. This severely deteriorates system performance. A rotation frequency detection (RFD) algorithm employing an eye scope latch can be used to adjust the clock and data recovery circuit to acquire the transmitter clock. However, the eye scope latch significantly increases the hardware complexity and power consumption and requires calibration of the eye scope latch.

OUT-OF-LOCK BASED CLOCK ACQUISITION

FIELD OF THE INVENTION

The present invention is related to systems and methods for clock acquisition in data storage and transmission systems.

BACKGROUND

Serializer and De-serializer (SerDes) circuits facilitate the transmission of data across a serial link. Data at one point is converted from parallel data to serial data and transmitted through a storage or transmission channel to the second point where it received and converted from serial data to parallel data. In general, a clock signal is not transmitted along with the data signal, and

SUMMARY

Various embodiments of the present invention provide systems, apparatuses and methods for out-of-lock based clock acquisition in data storage and transmission systems.

In some embodiments, an apparatus for recovering a clock from a data signal includes an out-of-lock detector configured to detect when a receiver data clock has a frequency offset with respect to a transmitter data clock associated with the data signal, an out-of-lock counter configured to count out-of-lock conditions for the receiver data clock, and a loop filter configured to correct the frequency offset in the receiver data clock based at least in part on the count of out-of-lock conditions.

This summary provides only a general outline of some embodiments of the invention. The phrases "in one embodiment," "according to one embodiment," "in various embodiments", "in one or more embodiments", "in particular embodiments" and the like generally mean the particular feature, structure, or characteristic following the phrase is included in at least one embodiment of the present invention, and may be included in more than one embodiment of the present invention. Importantly, such phrases do not necessarily refer to the same embodiment. This summary provides only a general outline of some embodiments of the invention. Additional embodiments are disclosed in the following detailed description, the appended claims and the accompanying drawings.

BRIEF DESCRIPTION OF THE FIGURES

A further understanding of the various embodiments of the present invention may be realized by reference to the figures which are described in remaining portions of the specification. In the figures, like reference numerals may be used throughout several drawings to refer to similar components. In the figures, like reference numerals are used throughout several figures to refer to similar components.

DETAILED DESCRIPTION OF THE INVENTION

The present invention is related to systems and methods for out-of-lock based clock acquisition in a data storage and transmission systems. The out-of-lock based clock acquisition can be applied in any circuit, such as, but not limited to, an out-of-lock based frequency correction calculation circuit for a clock and data recovery loop filter in the serializer/de-serializer (SerDes) of a storage device or transmission system. The out-of-lock based frequency correction calculation circuit identifies and counts the number of out-of-lock events, based for example on detection of patterns representing an out-of-lock condition, and uses the count of out-of-lock events to acquire the receiver clock even in the presence of potentially large frequency offsets between the receiver clock and the transmitter clock. The out-of-lock based frequency correction calculation circuit acquires the receiver clock quickly using relatively simple circuitry in the presence of both positive and negative frequency offsets.

Figure 1A:
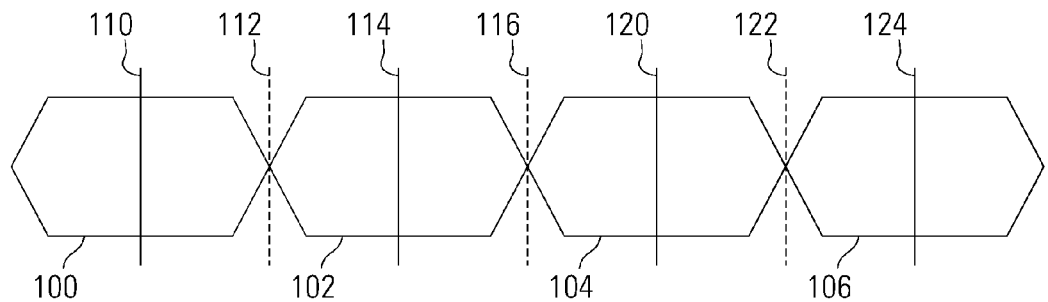
FIGS. 1A-1B depict eye diagrams of digital non-return to zero data with a correctly acquired clock and a mis-acquired clock, respectively, in accordance with some embodiments of the present invention.
Figure 1B:
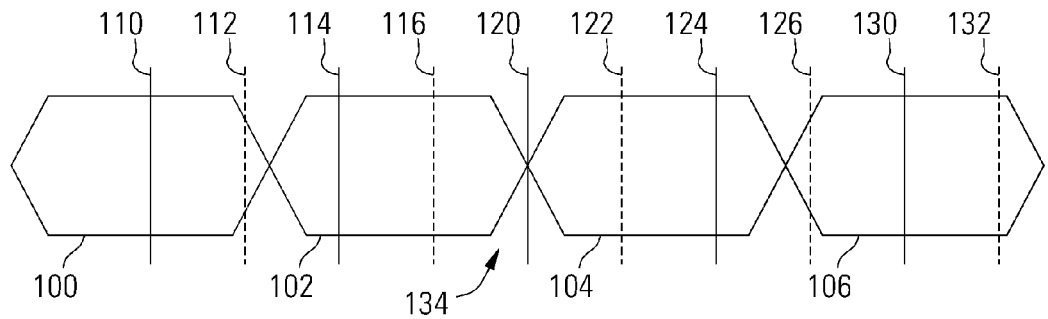

Turning to FIG. 1A, an eye diagram of digital non-return to zero data illustrates four consecutive bits 100, 102, 104, 106 with a correctly acquired clock. In the eye diagram of FIG. 1A, data samples 110, 114, 120, 124 are aligned at the center of the eye for each bit 100, 102, 104, 106, and transition samples 112, 116, 122 are aligned at the transition between each of the bits 100, 102, 104, 106. In other words, the data sampling latch is correctly placed for each bit 100, 102, 104, 106 and the transition sampling latch is correctly placed at each transition between the bits 100, 102, 104, 106. However, as shown in FIG. 1B, if there is mis-acquisition in the presence of a frequency offset between the receiver clock and the transmitter clock, the clock and data recovery loop intermittently enters an "out-of-lock" (OOL) state wherein the data clock aligns to the eye transitions and the transition clock aligns to the eye center, as at point 134. The data samples 110, 114, 120, 124, 130 and the transition samples 112, 116, 122, 126, 132 are not consistently and correctly placed at eye centers and eye transitions, but drift over data bits.

At out-of-lock events (e.g., 134), three consecutive samples v(k), v(k−½), v(k−1) will result in either a data pattern of [1, −1, 1] or [−1, 1, −1] given data using non-return-to-zero (NRZ) signaling. In other words, an out-of-lock event will either yield an alternating three-sample sequence where v(k)=+1, v(k−½)=−1, v(k−1)=+1 or where v(k)=−1, v(k−½)=+1, v(k−1)=−1, with v(k) and v(k−1) referring to the signed current and previous data sample values and with v(k−½) referring to the signed transition sample value.

When the receiver clock is correctly acquired, the number of out-of-lock events within a sliding window equals 0, and the value of a digital clock and data recovery circuit's integral loop register IREG settles to a value indicative of the frequency offset between the transmitter and receiver clocks, such that the value in the clock and data recovery circuit's integral loop register causes the frequency offset to be corrected enabling incoming data bits in the receiver to be correctly sampled. When the clock and data recovery circuit is not locked on the correct receiver clock, however, the number of out-of-lock events in the window is non-zero, and the value in the clock and data recovery circuit's integral loop register diverges away from the value it is expected to settle to. The out-of-lock based frequency correction calculation circuit corrects the divergence in the clock and data recovery circuit's integral loop register aiding the clock and data recovery circuit's receiver clock acquisition even in the presence of high frequency offsets.

Figure 2:
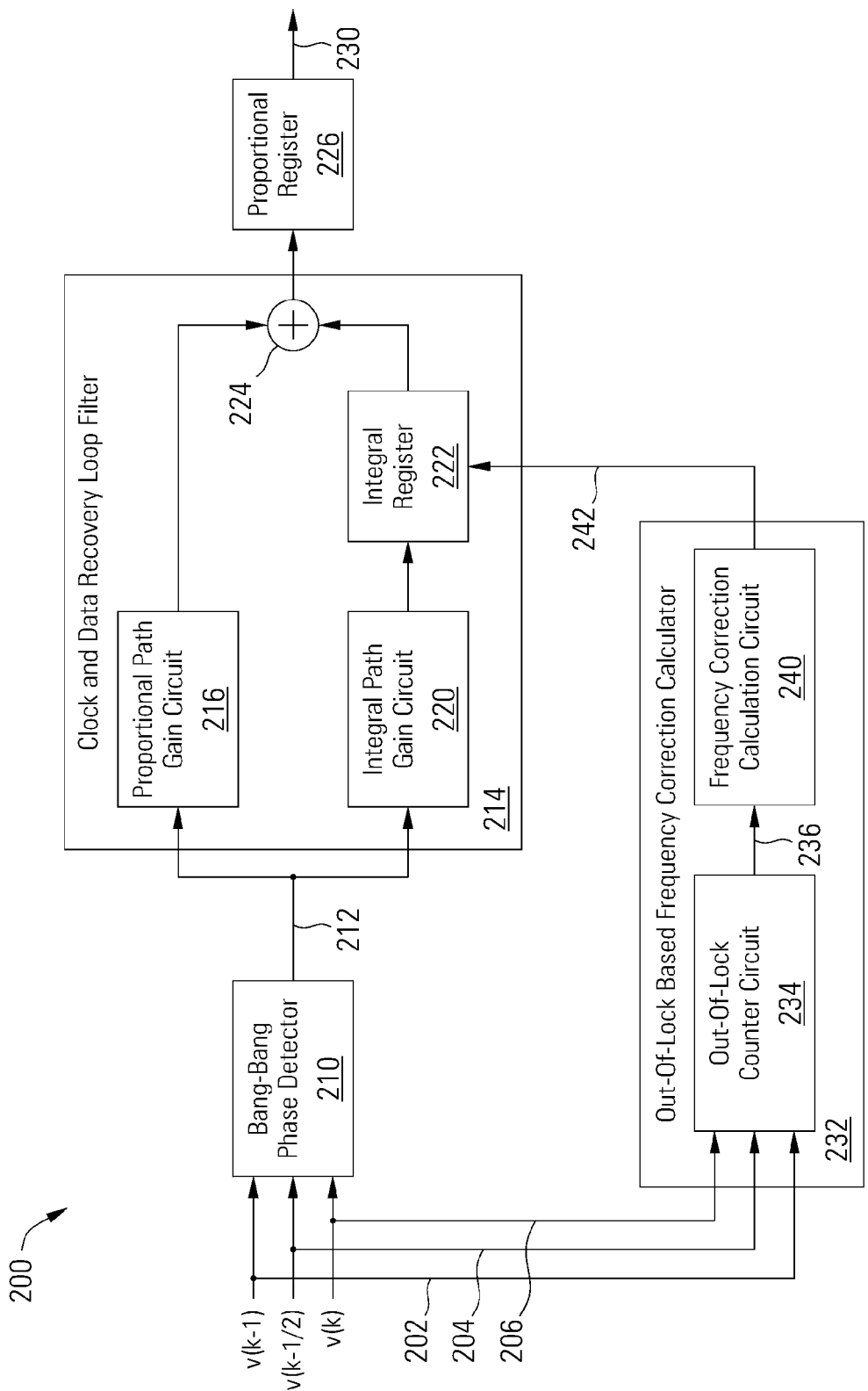
FIG. 2 depicts a clock and data recovery circuit with out-of-lock based clock acquisition in accordance with some embodiments of the present invention.

Turning now to FIG. 2, a clock and data recovery circuit 200 with out-of-lock based clock acquisition is depicted in accordance with some embodiments of the present invention. The clock and data recovery circuit 200 can be included, for example, in a serializer/de-serializer circuit used to convert incoming analog data in a receiver to digital data samples. In some embodiments, the incoming analog data is an analog waveform representing digital non-return-to-zero data, which is sampled by an analog-to-digital converter (not shown) upstream from the clock and data recovery circuit 200. The receiver clock controls the sampling points of the analog-to-digital converter and should be correctly aligned with the transmitter clock that was associated with the original non-return-to-zero data when it was stored or transmitted. The clock and data recovery circuit 200 with out-of-lock based clock acquisition identifies and corrects frequency offsets between the transmitter clock and receiver clock so that the analog data can be correctly sampled to yield digital data samples.

A bang-bang phase detector 210 in the clock and data recovery circuit 200 receives three consecutive samples v(k) 202, v(k−½) 204, v(k−1) 206 of incoming data. The bang-bang phase detector 210 is a non-linear phase detector that, in some embodiments, compares the negative edge of the receiver clock with the transition sample v(k−½) 204, and the present data sample v(k) 202 with the previous data sample v(k−1) 206 to yield a phase error signal 212 that indicates when the receiver clock is late or early. The phase detection is not limited to any particular circuit or technique. Based upon the disclosure provided herein, one of ordinary skill in the art will recognize a variety of bang-bang phase detection circuits or other phase detection circuits that can be used in relation to different embodiments of the present invention.

The phase error signal 212 is provided to a clock and data recovery loop filter 214, which calculates a control word 230 that is stored in a proportional register 226 to control a voltage controlled oscillator or other clock generator that generates the receiver clock. In some embodiments, the clock and data recovery loop filter 214 includes a proportional path gain circuit 216, an integral path gain circuit 220 and integral register 222, and combination circuit 224. The proportional path gain circuit 216 in the proportional control loop applies a control word for a limited duration of time to cause a temporary change in frequency. In some embodiments, the proportional control word generated by the proportional path gain circuit 216 effectively applies pulse width modulation control to the receiver clock, causing a temporary change up or down in frequency without a permanent change to the receiver clock frequency. The proportional path gain circuit 216 can include any suitable circuit for applying temporary corrections to the receiver clock frequency. Based upon the disclosure provided herein, one of ordinary skill in the art will recognize a variety of proportional control loop circuits that can be used in relation to different embodiments of the present invention.

The integral path control loop includes the integral path gain circuit 220 and integral register 222 which yield an integral control word stored in integral register 222 which changes a the receiver clock frequency for an extended duration of time until the value in the integral register 222 is changed. The integral path gain circuit 220 operates in some embodiments as a limiting integrator to calculate the integral control word for integral register 222, integrating the output of the bang-bang phase detector 210. The integral path gain circuit 220 can include any suitable circuit for integrating the phase error signal 212. Based upon the disclosure provided herein, one of ordinary skill in the art will recognize a variety of integral path gain circuits that can be used in relation to different embodiments of the present invention.

Where the frequency offset between the transmitter clock and the receiver clock is large, clock acquisition in the clock and data recovery circuit 200 can be extremely challenging even with a well designed clock and data recovery loop filter 214 due to the high latency of the loop filter 214. An out-of-lock based frequency correction calculation circuit 232 calculates a correction 242 for the integral register 222 based on a count of out-of-lock events, rapidly correcting integral loop register divergence and thus aiding clock and data recovery acquisition even in the presence of large frequency offsets.

An out-of-lock counter circuit 234 receives the three consecutive samples v(k) 202, v(k−½) 204, v(k−1) 206 of incoming data at the input to the bang-bang phase detector 210 and compares the samples 202, 204, 206 with data patterns [1, −1, 1] and [−1, 1, −1] that identify the out-of-lock event. As each new sample is received and the sample index k is incremented, the out-of-lock counter circuit 234 again compares the samples 202, 204, 206 with the out-of-lock data patterns. For each out-of-lock event when the samples 202, 204, 206 within a detection window contain an out-of-lock data pattern, the counter in out-of-lock counter circuit 234 is incremented.

The resulting out-of-lock count 236 is provided to a frequency correction calculation circuit 240. When the out-of-lock count 236 is zero, the receiver clock is correctly acquired and no frequency correction is needed. When the out-of-lock count 236 is non-zero, the frequency correction calculation circuit 240 calculates the correction 242 for the integral register 222 based on a count of out-of-lock events. The value of the out-of-lock counter is indicative of the number of bit slips, which is in turn directly related to the magnitude of the frequency offset between the transmitter and receiver clocks. The direction of integral register value divergence is opposite of the direction the frequency offset between the transmitter and receiver clocks. The frequency offset between the transmitter and receiver clocks is thus represented as follows:

$$\text{Frequency Offset} = \frac{n}{N} * 1e6 \text{ PPM} \quad \text{(Eq 1)}$$

where N is the number of bits in the out-of-lock counter window and n is the number of out-of-lock events in the window. For example, given a window of N=1000 bits, and the out-of-lock count 236 indicates n=3 bits slips in the window, the frequency offset is 3000. The integral register 222 is corrected by the out-of-lock based frequency correction calculation circuit 232 to account for this frequency offset.

For every digital clock and data recovery loop filter 214, there exists a one-to-one mapping between the frequency offset and the value of the integral register 222. Given that each part per million (ppm) of frequency offset corresponds to a value for the integral register 222 of x, where x is determinable based on the design parameters of the digital clock and data recovery loop filter 214, the frequency offset indicates that the value of the integral register 222 needs to be corrected as follows:

$$IREG = \frac{n}{N} * x * 1e6 \quad \text{(Eq 2)}$$

where IREG is the correction to the value for the integral register 222, N is the number of bits in the out-of-lock counter window, n is the number of out-of-lock events in the window, and x is the design parameter representing the mapping between the integral register value and the frequency offset number. Depending on the direction of divergence of the value for the integral register 222, the above correction is applied to the integral register 222 in the opposite direction.

The out-of-lock counter circuit 234 and the frequency correction calculation circuit 240 can include any suitable circuits for identifying out-of-lock events based on data patterns in input samples, for counting the number of out-of-lock events within a window, for identifying when the number of out-of-lock events within a window is greater than zero, and for calculating the correction to the value for the integral register 222. For example, the out-of-lock counter circuit 234 and the frequency correction calculation circuit 240 can include comparators, shift registers, counters, multipliers, dividers etc. as desired to identify and count out-of-lock events within a window and to calculate the correction for the integral register 222 based on Equation 2. Based upon the disclosure provided herein, one of ordinary skill in the art will recognize a variety of circuits that can be used in the out-of-lock based frequency correction calculation circuit 232 in relation to different embodiments of the present invention.

As the clock and data recovery loop filter 214 operates to control the frequency of the receiver clock with the proportional path gain circuit 216 and integral path gain circuit 220, the out-of-lock based frequency correction calculation circuit 232 applies corrections to the integral register 222 based on out-of-lock events, thus aiding clock and data recovery acquisition even in the presence of large frequency offsets. In summary, the out-of-lock count circuit 234 uses the inputs v(k) 202, v(k−½) 204, v(k−1) 206 to the bang-bang phase detector 210 to determine the number of out-of-lock events within a window. If the number of out-of-lock events within the window is greater than zero, the clock and data recovery circuit is out of lock, and the corrective value 242 is calculated according to Equation 2 and is loaded into the integral register 222. The sign of the correction to the integral register 222 is the inverse of the direction of the divergence in IREG calculated by Equation 2. If IREG is decreasing over the window of observation, the correction 242 is applied so as to increase the IREG value calculated by Equation 2. If IREG is increasing over the window of observation, the correction 242 is applied so as to decrease the IREG value calculated by Equation 2.

Figure 3A:
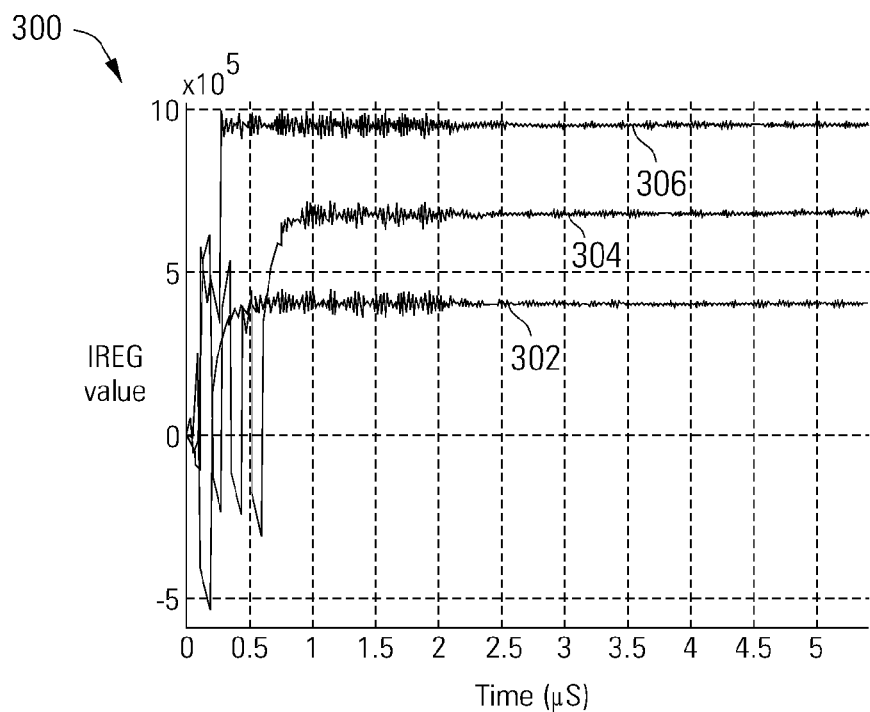
FIG. 3A is a plot of integration register values calculated by an out-of-lock based frequency correction calculation circuit for a clock and data recovery loop filter based on three different positive frequency offsets between a receiver clock and a transmitter clock in accordance with some embodiments of the present invention.

Turning now to FIG. 3A, a plot 300 illustrates IREG values calculated by an out-of-lock based frequency correction calculation circuit (e.g., 232) to correct the integral register 222 of a clock and data recovery loop filter (e.g., 214) based on three different positive frequency offsets between a receiver clock and a transmitter clock in accordance with some embodiments of the present invention. In these examples, the window size is N=1000 bits and the mapping x between the integral register value and the frequency offset number for the digital clock and data recovery loop is 135. A first plot line 302 corresponds to a positive frequency offset of 3000 ppm, a second plot line 304 corresponds to a positive frequency offset of 5000 ppm, and a third plot line 306 corresponds to a positive frequency offset of 7000 ppm. The IREG values are calculated according to Equation 2. As shown in the plot 300, the IREG value converges to about 135*f, or about $4.05 \times 10^5$ for a positive frequency offset f of 3000 in plot line 302, about $6.75 \times 10^5$ for a positive frequency offset f of 5000 in plot line 304, and about $9.45 \times 10^5$ for a positive frequency offset f of 7000 in plot line 306.

Figure 3B:
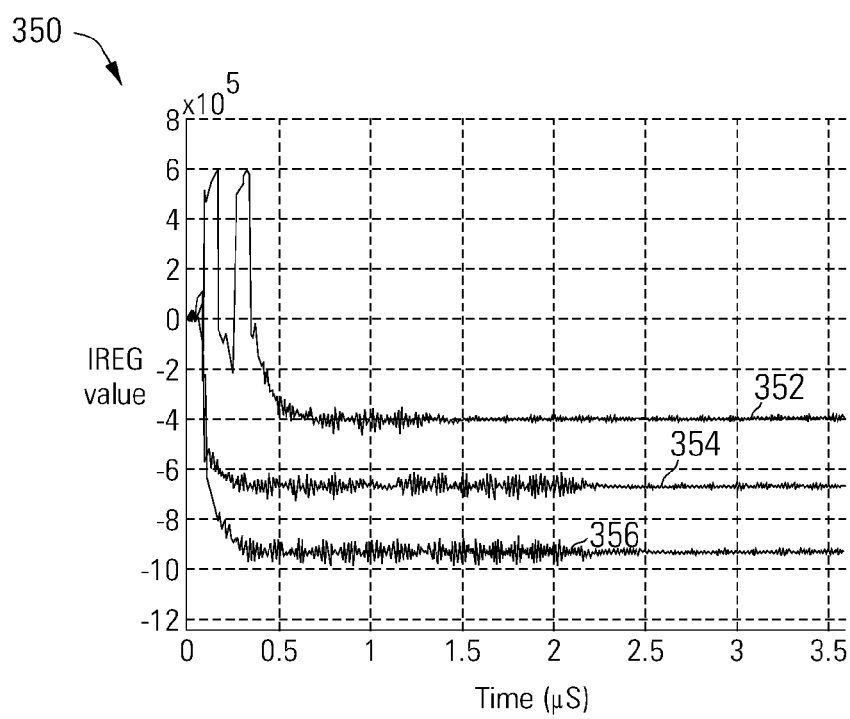
FIG. 3B is a plot of integration register values calculated by an out-of-lock based frequency correction calculation circuit for a clock and data recovery loop filter based on three different negative frequency offsets between a receiver clock and a transmitter clock in accordance with some embodiments of the present invention.

Again, the out-of-lock based frequency correction calculation circuit aids in clock acquisition in the presence of both positive and negative frequency offsets. Turning to FIG. 3B, a plot 350 illustrates IREG values calculated by an out-of-lock based frequency correction calculation circuit (e.g., 232) to correct the integral register 222 of a clock and data recovery loop filter (e.g., 214) based on three different negative frequency offsets between a receiver clock and a transmitter clock in accordance with some embodiments of the present invention. In these examples, the window size is N=1000 bits and the mapping x between the integral register value and the frequency offset number for the digital clock and data recovery loop is 135. A first plot line 352 corresponds to a frequency offset of −3000 ppm, a second plot line 354 corresponds to a frequency offset of −5000 ppm, and a third plot line 356 corresponds to a frequency offset of −7000 ppm. The IREG values are calculated according to Equation 2. As shown in the plot 350, the IREG value converges to about 135*f, or about $4.05 \times 10^5$ for a frequency offset f of −3000 in plot line 352, about $6.75 \times 10^5$ for a frequency offset f of −5000 in plot line 354, and about $9.45 \times 10^5$ for a frequency offset f of −7000 in plot line 356.

In some embodiments, the window size N is selected to provide a relatively low convergence time. A small value of N causes the out-of-lock counter to be updated faster, however, this does not necessarily result in a reduction in convergence time. In some cases, when N is small (~100), n/N could become relatively large meaning that the magnitude of the IREG correction is coarse, and the convergence time increases. Conversely, a large value of N means there is more averaging performed. However, this also does not necessarily result in a reduction in convergence time. When N is large (~10000), n can be large as well at higher frequency offset values, which also means that the magnitude of the IREG correction is again coarse, and the convergence time increases. In some embodiments, an intermediate window size N, such as, for example, about 1000, provides a minimum in the convergence time for the IREG correction.

Figure 4:
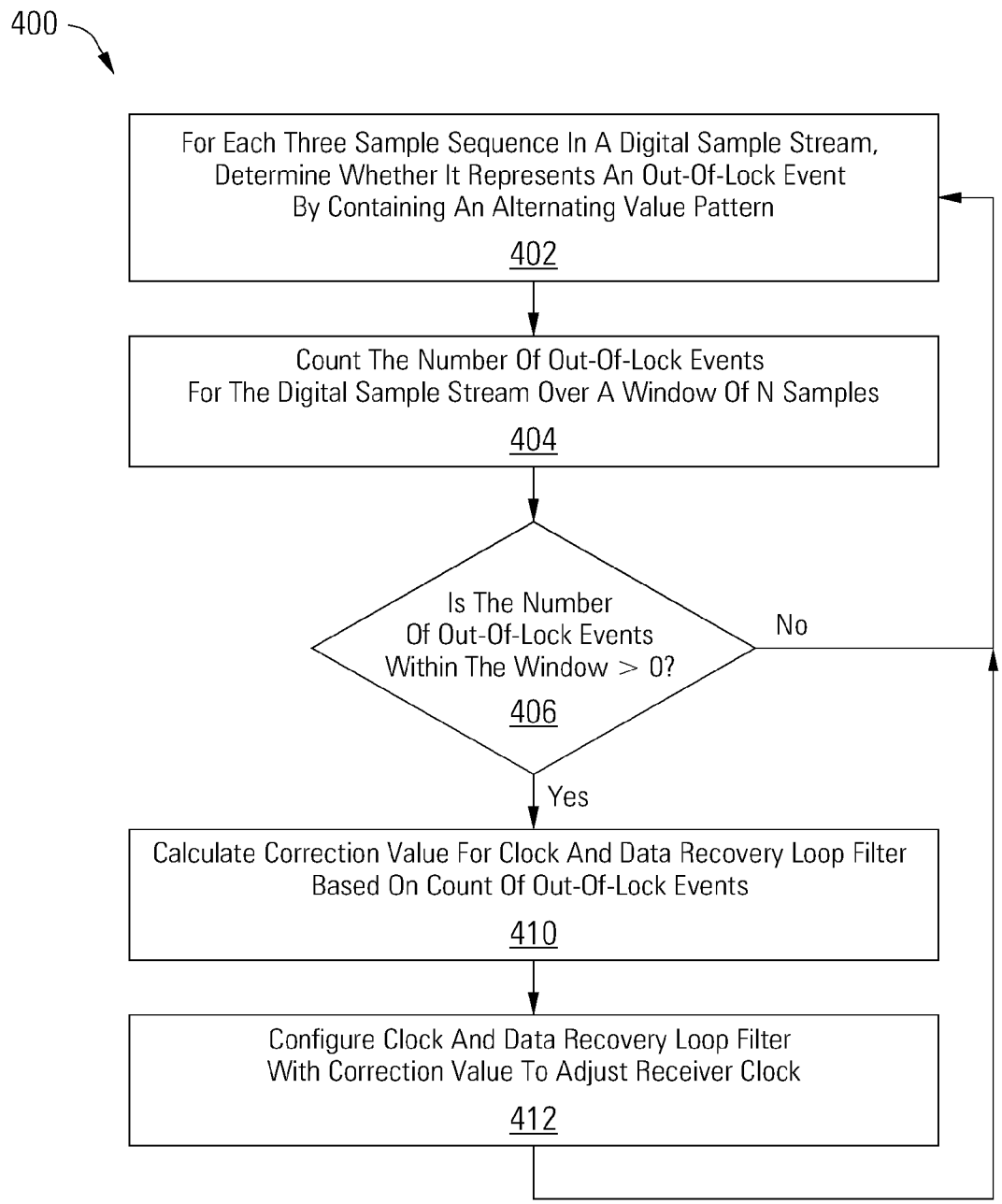
FIG. 4 is a flow diagram showing a method for out-of-lock based clock acquisition in a serializer/de-serializer in accordance with some embodiments of the present invention.

Turning now to FIG. 4, a flow diagram 400 illustrates an example method for out-of-lock based clock acquisition in a serializer/de-serializer or other application in accordance with some embodiments of the present invention. The serializer/de-serializer can be used in any of a number of applications, such as, but not limited to, storage devices and transmission systems, etc., to correctly align the receiver sampling clock for a digital sample stream in the serializer/de-serializer to the transmitter clock. The digital sample stream is not limited to any particular type or format of data. In some embodiments, the digital sample stream represents non-return-to-zero (NRZ) data.

Following flow diagram 400, for each three sample sequence in a digital sample stream, it is determined whether the three sample sequence represents an out-of-lock event by containing an alternating value pattern. (Block 402) In some embodiments, the alternating value pattern in the three sample sequence of either [1, −1, 1] or [−1, 1, −1]. Other embodiments can detect out-of-lock events using different numbers of samples and different detection means. The identification of the out-of-lock event can be performed in any suitable manner, such as, but not limited to, a three-bit shift register and comparators to assert an out-of-lock detected signal whenever the three sample sequence matches any of the alternating value patterns. Based upon the disclosure provided herein, one of ordinary skill in the art will recognize a variety of circuits that may be used to detect an out-of-lock event in relation to different embodiments of the present invention.

The number of out-of-lock events for the digital sample stream are counted over a window of N samples. (Block 404) The count thus represents the number of out-of-lock events for each three sample sequence of data samples within the sliding window of N samples as the input data samples slide through the window. A determination is made as to whether the number of out-of-lock events is greater than 0. (Block 406) If there are no out-of-lock events within the window, it can be assumed that the receiver clock is aligned with the transmitter clock, and that no frequency correction need be performed on the receiver clock. However, if the number of out-of-lock events within the window is greater than 0, a correction value is calculated for a clock and data recovery loop filter based on the count of out-of-lock events. (Block 410) In some embodiments, the correction value comprises a register value for an integral register IREG in the clock and data recovery loop filter, calculated according to Equation 2 above. The integral register is configured in the digital clock and data recovery loop filter using the calculated correction value in order to adjust the receiver clock. (Block 412)

Figure 5:
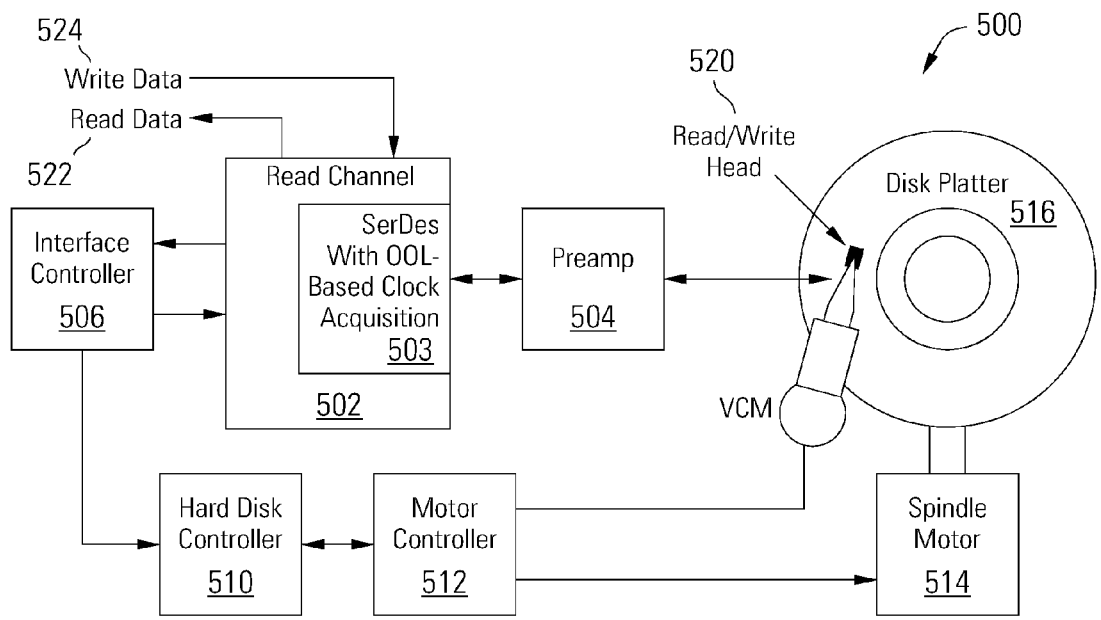
FIG. 5 depicts a storage system including a read channel with a serializer/de-serializer with out-of-lock based clock acquisition in accordance with some embodiments of the present invention.

Turning to FIG. 5, a storage system 500 is illustrated as an example application of a read channel with a serializer/de-serializer employing out-of-lock based clock acquisition in accordance with some embodiments of the present invention. The storage system 500 includes a read channel circuit 502 with loop pulse estimation with an absolute sum constraint in accordance with some embodiments of the present invention. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 recovers the clock, aligning the receiver sampling clock to the transmitter clock used when writing the data to the disk platter 516. A serializer/de-serializer circuit 503 in the read channel circuit 502 performs out-of-lock based clock acquisition for fast and robust clock acquisition even in the presence of large frequency offsets between the receiver clock and the transmitter clock. The read channel circuit 502 can then decode the resulting digital data to recreate the information originally written to disk platter 516. This data is provided as read data 522 to a receiving circuit. A write operation is substantially the opposite of the preceding read operation with write data 524 being provided to read channel circuit 502. This data is then encoded and written to disk platter 516.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

In addition, it should be noted that storage system 500 may be modified to include solid state memory that is used to store data in addition to the storage offered by disk platter 516. This solid state memory may be used in parallel to disk platter 516 to provide additional storage. In such a case, the solid state memory receives and provides information directly to read channel circuit 502. Alternatively, the solid state memory may be used as a cache where it offers faster access time than that offered by disk platter 516. In such a case, the solid state memory may be disposed between interface controller 506 and read channel circuit 502 where it operates as a pass through to disk platter 516 when requested data is not available in the solid state memory or when the solid state memory does not have sufficient storage to hold a newly written data set. Based upon the disclosure provided herein, one of ordinary skill in the art will recognize a variety of storage systems including both disk platter 516 and a solid state memory.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that some functions of the blocks, systems or circuits discussed herein may be implemented in either software or firmware. In some such cases, some portions of the system may be implemented using their software or firmware equivalent.

In conclusion, the present invention provides novel systems, apparatuses and methods for out-of-lock based clock acquisition. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An apparatus for recovering a clock from a data signal comprising:
   an out-of-lock detector configured to detect when a receiver data clock has a frequency offset with respect to a transmitter data clock associated with the data signal;
   an out-of-lock counter configured to count out-of-lock conditions for the receiver data clock;
   a loop filter configured to correct the frequency offset in the receiver data clock based at least in part on the count of out-of-lock conditions; and
   a frequency correction calculator operable to configure the loop filter based on the count in the out-of-lock counter, wherein the count is related to a magnitude of the frequency offset.

2. The apparatus of claim 1, wherein the out-of-lock detector is configured to compare values of three samples taken at consecutive half-bit period intervals to identify the out-of-lock condition when the three samples have alternating values.

3. The apparatus of claim 2, further comprising a phase detector circuit, wherein the three samples comprise an input to the phase detector circuit.

4. The apparatus of claim 3, wherein the phase detector circuit comprises a bang-bang phase detector.

5. The apparatus of claim 2, wherein the three samples comprise a sequence of a data sample, a transition sample and a second data sample.

6. The apparatus of claim 2, wherein the alternating values comprise a data pattern of 1, −1, 1.

7. The apparatus of claim 2, wherein the alternating values comprise a data pattern of −1, 1, −1.

8. The apparatus of claim 1, wherein the data at an input to the out-of-lock detector comprises non-return-to-zero data.

9. The apparatus of claim 1, wherein the out-of-lock conditions comprise a receiver data clock being aligned with an eye transition and a corresponding transition clock being aligned with an eye center for input data.

10. The apparatus of claim 1, wherein the out-of-lock counter is configured to count a number of out-of-lock conditions during a window of length N bits.

11. The apparatus of claim 1, wherein the loop filter comprises a proportional path gain circuit, an integral path gain circuit, and an integral register configured to apply a frequency correction to the receiver data clock, wherein a value in the integral register is calculated by the frequency correction calculator based on the count in the out-of-lock counter.

12. The apparatus of claim 1, wherein the out-of-lock detector and the out-of-lock counter are embodied in an integrated circuit.

13. The apparatus of claim 1, wherein the apparatus comprises a storage device.

14. A method for out-of-lock based clock acquisition, comprising:
   identifying out-of-lock events in digital data;
   counting the out-of-lock events within a window;
   calculating a correction value for a clock recovery loop filter based on a count of the out-of lock events; and
   configuring the clock recovery loop filter based on the correction value.

15. The method of claim 14, wherein configuring the clock recovery loop filter based on the correction value comprises setting a value in an integral register based on the correction value.

16. The method of claim 14, wherein identifying the out-of-lock events in digital data comprises detecting alternating data patterns in a sequence of samples in the digital data.

17. The method of claim 16, wherein the sequence of samples comprises a data sample, a transition sample and a second data sample.

18. The method of claim 14, wherein calculating the correction value comprises dividing a count of the out-of-lock events by a number of data bits in the window and multiplying a result by a value mapping a frequency offset between a transmitter and a receiver clock with a value of an integral register in the clock recovery loop filter.

19. An apparatus for out-of-lock based clock acquisition comprising:
   a phase detection circuit;
   a clock recovery loop filter connected to an output of the phase detection circuit, the clock recovery loop filter comprising an integral register;
   means for counting out-of-lock events in an input to the phase detection circuit; and
   means for setting a value of the integral register based on a count of the out-of-lock events.

20. The apparatus of claim 19, wherein the means for counting out-of-lock events in an input to the phase detection circuit generates an out-of-lock count of zero when a receiver clock is correctly acquired and a non-zero out-of-lock count when a frequency offset exists between the receiver clock and a transmitter clock.

* * * * *